US008531836B2

(12) United States Patent
Iwamoto et al.

(10) Patent No.: US 8,531,836 B2
(45) Date of Patent: Sep. 10, 2013

(54) ELECTRONIC APPARATUS

(75) Inventors: Akira Iwamoto, Osaka (JP); Masaru Furujiku, Osaka (JP); Yoshinari Matsuyama, Osaka (JP)

(73) Assignee: Panasonic Corporation, Osaka (JP)

( * ) Notice: Subject to any disclaimer, the term of this patent is extended or adjusted under 35 U.S.C. 154(b) by 7 days.

(21) Appl. No.: 13/330,126

(22) Filed: Dec. 19, 2011

(65) Prior Publication Data

US 2012/0155000 A1   Jun. 21, 2012

(30) Foreign Application Priority Data

Dec. 20, 2010   (JP) ................... 2010-283326

(51) Int. Cl.
*G06F 1/16* (2006.01)
*B41J 11/56* (2006.01)
*F16M 1/00* (2006.01)
*A47G 29/00* (2006.01)
*A47B 91/00* (2006.01)

(52) U.S. Cl.
USPC ...... 361/679.59; 400/681; 248/677; 248/688; 312/351.3

(58) Field of Classification Search
USPC ............. 361/679.55–679.59, 679.01–679.45; 345/156, 157, 168, 169, 905; 312/223.1, 312/223.2, 351.3; 400/681; 248/677, 688, 248/918
See application file for complete search history.

(56) References Cited

U.S. PATENT DOCUMENTS

| | | | | |
|---|---|---|---|---|
| 5,552,960 | A * | 9/1996 | Nelson et al. | 361/679.54 |
| 5,646,872 | A * | 7/1997 | Yonenaga et al. | 708/173 |
| 6,053,589 | A * | 4/2000 | Lin | 312/271 |
| 6,097,595 | A * | 8/2000 | Cipolla | 361/679.21 |
| 6,181,554 | B1 * | 1/2001 | Cipolla et al. | 361/679.46 |
| 6,437,978 | B1 * | 8/2002 | Ozaki et al. | 361/679.46 |
| 6,459,573 | B1 * | 10/2002 | DiStefano et al. | 361/679.46 |
| 6,839,226 | B2 * | 1/2005 | Chen | 361/679.2 |
| 7,566,043 | B2 * | 7/2009 | Chen | 248/616 |
| 7,916,478 | B2 * | 3/2011 | Tu et al. | 361/679.59 |
| 7,936,562 | B2 * | 5/2011 | Nagamura et al. | 361/679.59 |
| 8,023,040 | B2 * | 9/2011 | Zhou | 348/376 |
| 8,111,512 | B2 * | 2/2012 | Yeh et al. | 361/679.59 |
| 8,248,791 | B2 * | 8/2012 | Wang et al. | 361/679.59 |
| 8,305,753 | B2 * | 11/2012 | Chang | 361/679.59 |
| 8,335,079 | B2 * | 12/2012 | Yeh | 361/679.56 |
| 2010/0027218 | A1 * | 2/2010 | Lin et al. | 361/679.59 |
| 2010/0149752 | A1 * | 6/2010 | Lian | 361/679.59 |
| 2012/0187810 | A1 * | 7/2012 | Iwamoto et al. | 312/223.2 |

FOREIGN PATENT DOCUMENTS

JP   5-007084   1/1993

* cited by examiner

*Primary Examiner* — Jayprakash N Gandhi
*Assistant Examiner* — Nidhi Desai
(74) *Attorney, Agent, or Firm* — Hamre, Schumann, Mueller & Larson, P.C.

(57) ABSTRACT

The position of an electronic apparatus can be stabilized. At least one of foot portions of a notebook computer includes a height adjustment mechanism consisting of a ground contact member, a height adjustment member, and a screw. Thus, even if a variation in height dimension among the foot portions, deformation of a first housing, or the like causes the first housing to become unsteady, the unsteadiness of the first housing can be cancelled by adjusting the height of the foot portion to any height.

2 Claims, 14 Drawing Sheets

ELECTRONIC APPARATUS

BACKGROUND OF THE INVENTION

1. Field of the Invention

The present invention relates to an electronic apparatus including an apparatus supporting member.

2. Description of Related Art

Many electronic apparatuses that can be used on a desk like notebook computers, desktop computers, and so on are provided with an apparatus supporting member referred to as, for example, a "foot rubber" on a ground contact surface that is to be brought into contact with the desktop. The foot rubber is often formed of soft rubber and serves to soften an impact or a vibration applied to an electronic apparatus. For the purpose of efficient buffering and vibration absorption, in many cases, an electronic apparatus is provided with a plurality of foot rubbers. However, in recent years, there has been a trend toward reducing the weight of the main body of mobile apparatuses such as notebook computers so as to improve the portability, and with this trend, housings have become thinner. If the thickness of a housing of an apparatus is reduced, the housing may experience plastic deformation when an external strong impact or pressing force is applied thereto, and there are cases where a variation occurs in the ground contact state among a plurality of foot rubbers such that, for example, a part of the foot rubbers can no longer make contact with the desktop. When a variation occurs in the ground contact state among the foot rubbers, the position of the electronic apparatus when placed on the desktop or the like becomes unstable. Thus, a configuration that can adjust the height of the foot rubbers has been proposed.

JP H5-7084A discloses a structure of a foot portion for absorbing installation unsteadiness of a desktop apparatus. The structure consists of an adjustment foot that is rotationally inserted in a bottom surface of the desktop apparatus, biased in such a direction that it is prevented from falling out, and provided with two to four protrusions that are disposed on a surface opposing the bottom surface and equiangularly spaced in a radial direction. An insertion seat is provided on the bottom surface and has, in its center, an insertion hole in which the adjustment foot is inserted and has recesses with which tip portions of the protrusions engage. The recesses are equiangularly spaced at intervals of θ/N in the radial direction such that a series of N step-like engagement positions extending over a predetermined distance in an axial direction is repeatedly provided on the entire bottom surface.

However, since the configuration disclosed in JP H5-7084A is a configuration in which the adjustment foot is retained on the bottom surface of the desktop apparatus via a plate spring and a coil spring, positioning in the direction in which the adjustment foot falls out is not sufficient, and as a result, the adjustment foot may be displaced easily in the axial direction of an insertion axis portion. Accordingly, the adjustment foot can be rotated easily in the radial direction, resulting in changes in the height of the adjustment foot.

SUMMARY OF THE INVENTION

An electronic apparatus disclosed in the present application is an electronic apparatus including a plurality of foot portions on an under surface of a housing thereof, at least one of the plurality of foot portions including a height adjustment member, a surface on a first side thereof abutting on a bottom surface of a recess formed in the under surface of the housing and a surface on a second side thereof having a plurality of height adjustment surfaces of mutually different heights; a ground contact member, a surface on a first side thereof being provided with an abutment surface that can abut on the height adjustment surfaces of the height adjustment member and a surface on a second side thereof protruding from the under surface of the housing; and a retaining member detachably retaining the height adjustment member and the ground contact member on a ground contact portion, wherein a protruding amount of the ground contact member from the under surface of the housing can be changed by causing the surface on the first side of the ground contact member to abut on any height adjustment surface of the plurality of height adjustment surfaces.

According to the disclosure of the present application, it is possible reliably to position an apparatus supporting member and to stabilize the position of an electronic apparatus.

DETAILED DESCRIPTION OF THE INVENTION

Embodiment

1. Configuration of Electronic Apparatus

Figure 1:
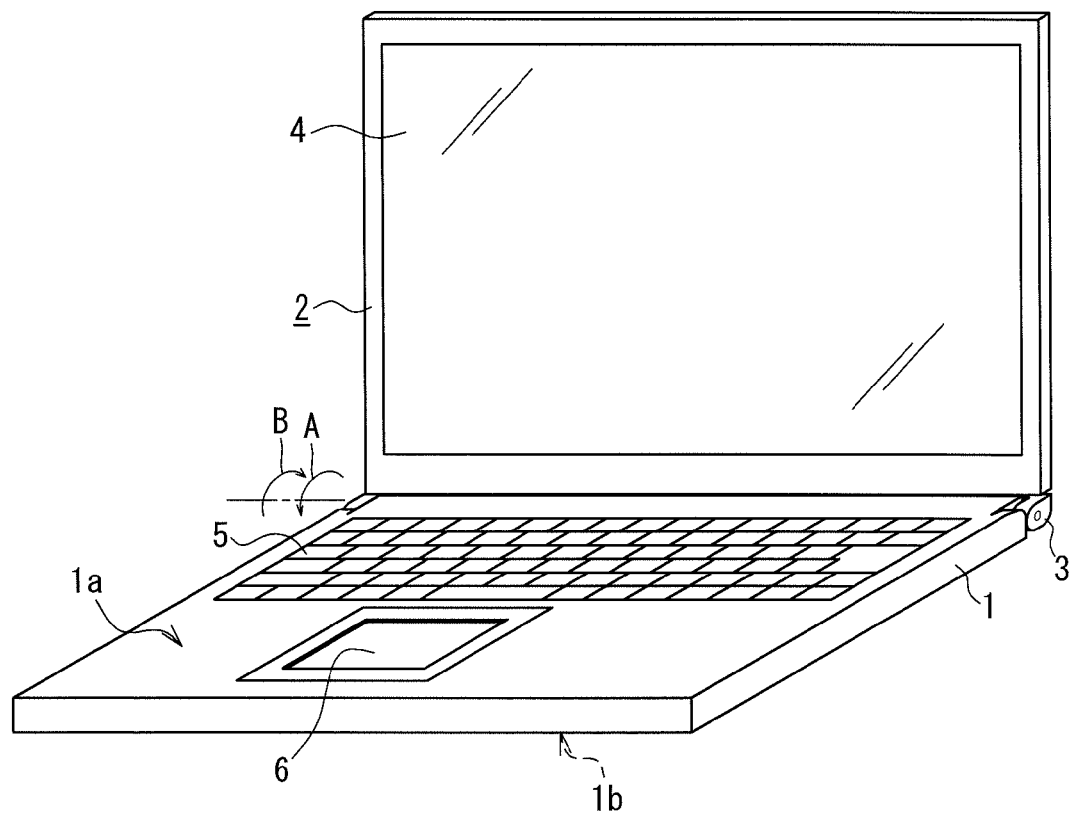
FIG. 1 is a perspective view of a notebook computer.

FIG. 1 is a perspective view showing an external configuration of a notebook computer according to an embodiment of the present invention. Although a notebook computer is used as an example of the electronic apparatus in the present embodiment, any apparatus that at least can be used on a desk can be used. Examples of the electronic apparatus may include a desktop computer, a display apparatus, and a desktop audio apparatus in addition to a notebook computer.

As shown in FIG. 1, the notebook computer includes a first housing 1 and a second housing 2. The first housing 1 houses a circuit board on which various types of electrical elements are mounted, a hard disk drive, and the like. The second housing 2 is provided with a display panel 4. The display panel 4 can be implemented with, for example, a liquid crystal display panel. The first housing 1 and the second housing 2 are supported by a hinge portion 3 such that these housings can swing relative to each other. The hinge portion 3 includes a swing shaft that supports the first housing 1 and the second housing 2 such that the housings can swing in a direction indicated by arrow A or B. A keyboard 5 and a pointing device 6 are provided on a top surface 1a of the first housing 1.

Figure 2:
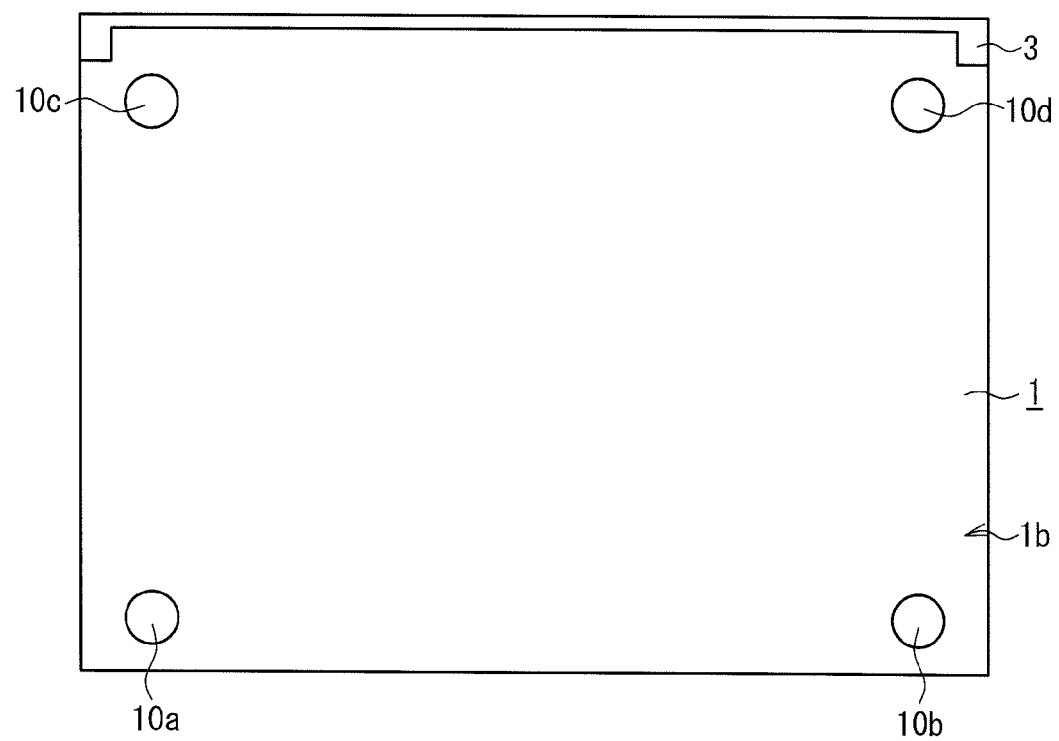
FIG. 2 is a plan view of an under surface side of a first housing.

FIG. 2 is a plan view of an under surface 1b of the first housing 1. The under surface 1b of the first housing 1 is a surface on the opposite side from the top surface 1a. As shown in FIG. 2, the under surface 1b of the first housing 1 is provided with four foot portions 10a, 10b, 10c, and 10d. Preferably, at least one of the foot portions 10a to 10d is provided with a height adjustment mechanism. In the present embodiment, the foot portion 10a has a height adjustment mechanism and the foot portions 10b to 10d do not have a height adjustment mechanism. The foot portions 10b to 10d can be formed of a resin material having so-called elastomeric properties, such as a copolymer resin having elasticity or viscoelasticity, an internally plasticized resin, or a resin having rubber elasticity. Preferably, all of the foot portions 10b to 10d have the same height from the under surface 1b of the first housing 1. It should be noted that although an apparatus supporting member for stabilizing the position of the notebook computer is herein referred to as a "foot portion", those members having the same functionality fall within the scope of the apparatus supporting member of the present invention even when they are referred to as other names (foot rubbers, rubber feet, insulators, and the like).

2. Configuration of Foot Portion with Height Adjustment Mechanism

Figure 3:
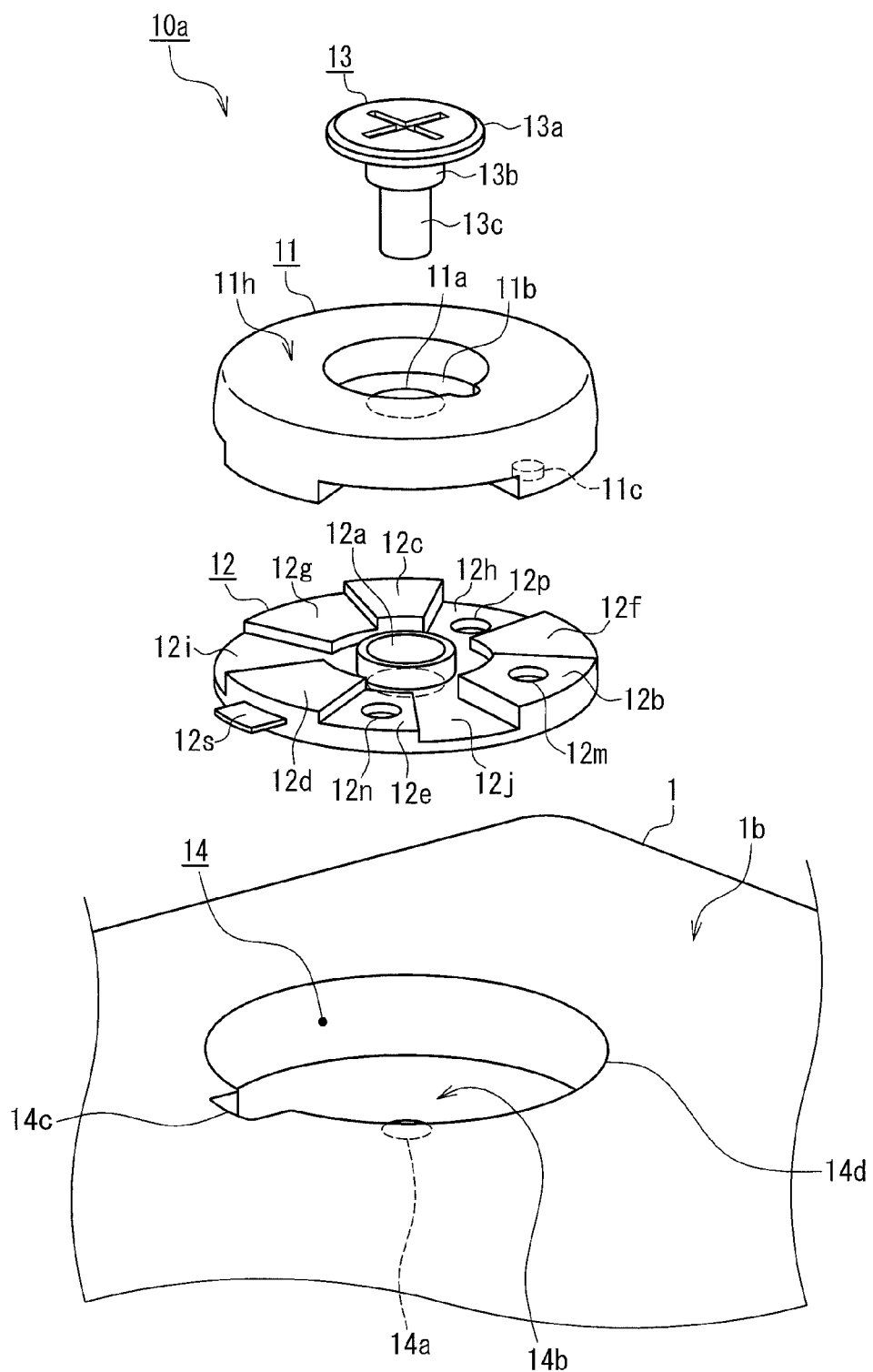
FIG. 3 is an exploded perspective view of a foot portion.

FIG. 3 is an exploded perspective view of the foot portion 10a provided with the height adjustment mechanism. The foot portion 10a includes a ground contact member 11, a height adjustment member 12, and a screw 13. The foot portion 10a is disposed and fixed inside a recess 14 formed in the under surface 1b of the first housing 1. The foot portion 10a partially protrudes from the under surface 1b of the first housing 1.

Figure 4A:
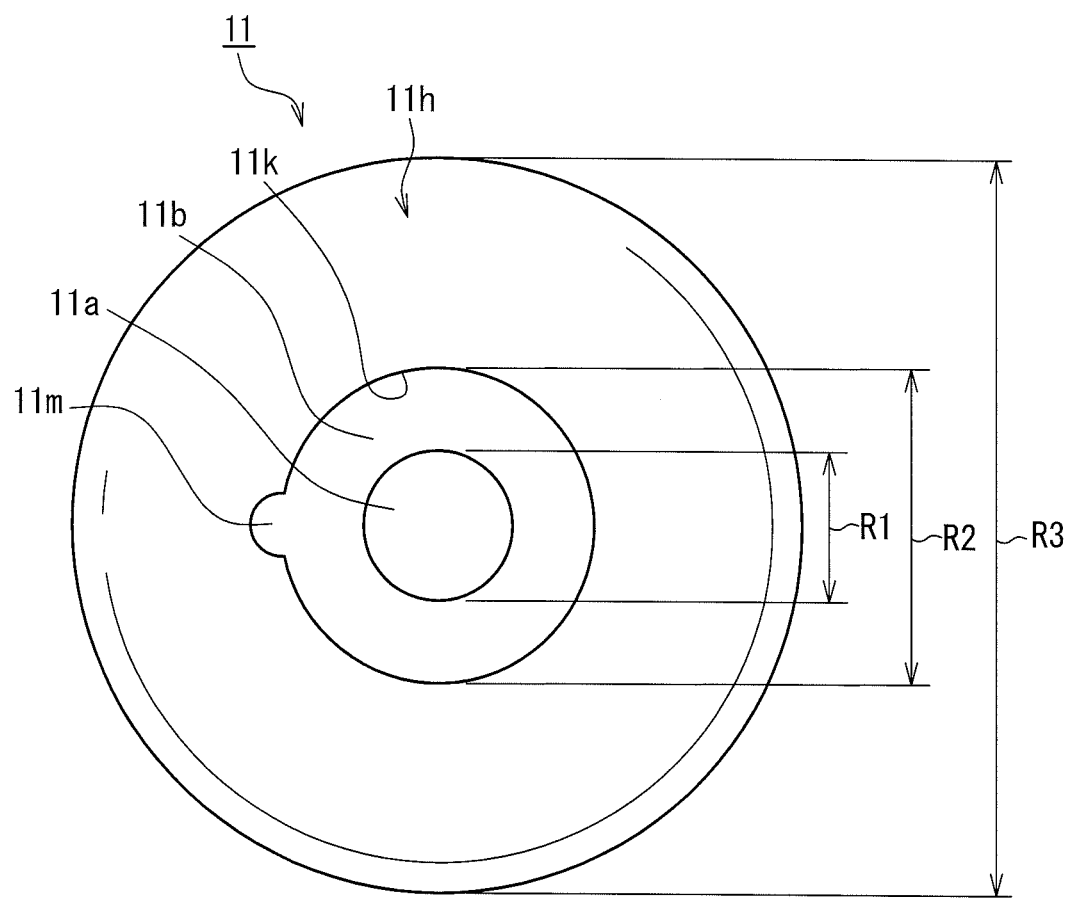
FIG. 4A is a plan view of a ground contact member.

The ground contact member 11 is a member that will come into contact with a mounting plane when the notebook computer is placed on the desktop or the like in such a position that the under surface 1b opposes the mounting plane. The ground contact member 11 is formed in a substantially cylindrical shape. Preferably, the ground contact member 11 is formed of a material that can provide a buffering effect, a vibration absorbing effect, and position stability (position immobility of the notebook computer when a pressing force is applied in a direction parallel to the mounting plane), and can be formed of, for example, a resin material having elastomeric properties such as that described above. The ground contact member 11 is disposed between the height adjustment member 12 and a head portion 13a of the screw 13. In a state in which the foot portion 10a is disposed in the recess 14, the ground contact member 11 protrudes from the under surface 1b of the first housing 1. The first housing 1 can be spaced apart from the mounting plane or the like by the ground contact member 11 protruding from the under surface 1b of the first housing 1, and therefore, an impact transmitted from the mount plane or the like can be buffered by the ground contact member 11, or a vibration transmitted from the mounting plane or the notebook computer or the like can be absorbed by the ground contact member 11. Moreover, heat dissipation of the first housing 1 can be improved by the first housing 1 being spaced apart from the mount plane or the like. As shown in FIG. 4A, the ground contact member 11 has a hole portion 11a formed in the center of a ground contact surface 11h. It should be noted that more detailed descriptions of the ground contact member 11 will be provided later.

The height adjustment member 12 is a member that is capable of adjusting the height of the ground contact member 11. The height adjustment member 12 is substantially disk-shaped. A surface on one side of the height adjustment member 12 is formed such that it can be brought into surface contact with a bottom surface 14b of the recess 14 of the housing 1, while a plurality of height restricting portions on which the ground contact member 11 can abut and that determine the height of the ground contact member 11 are formed on a surface of the other side of the height adjustment member 12. At least a part of each of the surfaces on both sides is formed as a flat surface. The height adjustment member 12 is disposed between the ground contact member 11 and the bottom surface 14b of the recess 14. Preferably, the height adjustment member 12 is formed of a material that is resistant to deformation under external pressure, such as a thermosetting resin or preferably a rigid resin having sliding properties, so that the height of the ground contact member 11 can be maintained stably. It should be noted that more detailed descriptions of the height adjustment member 12 will be provided later.

The screw 13 can retain the ground contact member 11 and the height adjustment member 12 in the recess 14 of the first housing 1. The screw 13 includes the head portion 13a, a cylinder portion 13b, and a screw portion 13c. The head portion 13a has an outer diameter that is at least larger than the outer diameter of the cylinder portion 13b. The cylinder portion 13b is formed between the head portion 13a and the screw portion 13c, and has an outer diameter that is at least smaller than the outer diameter of the head portion 13a and larger than the outer diameter of the screw portion 13c. The screw portion 13c has helical screw grooves (not shown) formed on its circumferential surface, and has an outer diameter that is at least smaller than the outer diameter of the cylinder portion 13b. The screw portion 13c can be screwed into a screw hole 14a formed in the bottom surface 14b of the recess 14.

The recess 14 is formed in the under surface 1b of the first housing 1. An edge portion 14d, which is an opening portion, of the recess 14 has a substantially circular shape. The recess 14 has an inner diameter R41 (described later with reference to FIG. 6A) that is at least larger than an outer diameter R3 (described later with reference to FIG. 4A) of the ground contact member 11 and an outer diameter R12 (described later with reference to FIG. 5A) of the height adjustment member 12. The recess 14 has a depth D41 (described later with reference to FIG. 6B) that is dimensioned so that when the ground contact member 11 and the height adjustment member 12 are accommodated in the recess 14, the ground contact surface 11h side of the ground contact member 11 protrudes beyond the under surface 1b of the first housing 1. The recess 14 has the screw hole 14a formed in the bottom surface 14b. The screw hole 14a is formed in the center of the bottom surface 14b so as to allow the ground contact member 11 to be rotated during height adjustment of the ground contact member 11. The recess 14 has a positioning recess 14c formed in a part of the edge portion 14d, that is, a part of the inner circumferential surface. The positioning recess 14c is engageable with a tab 12s formed on the height adjustment member 12.

Figure 4B:
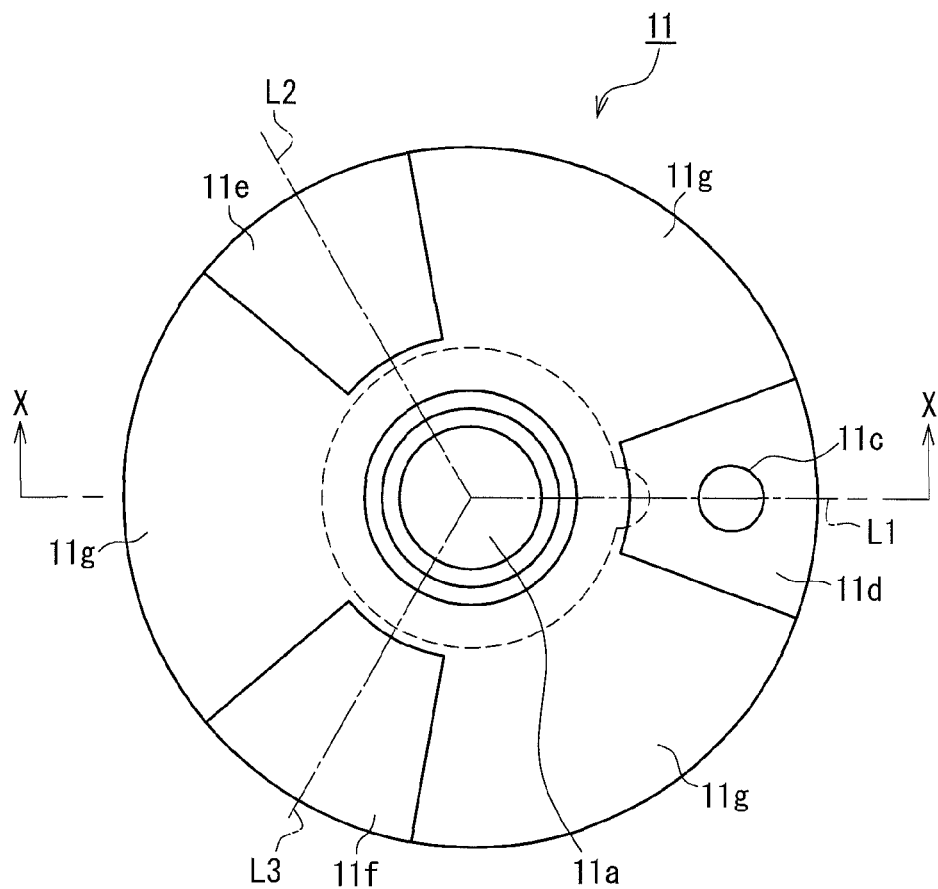
FIG. 4B is a plan view of the ground contact member.
Figure 4C:
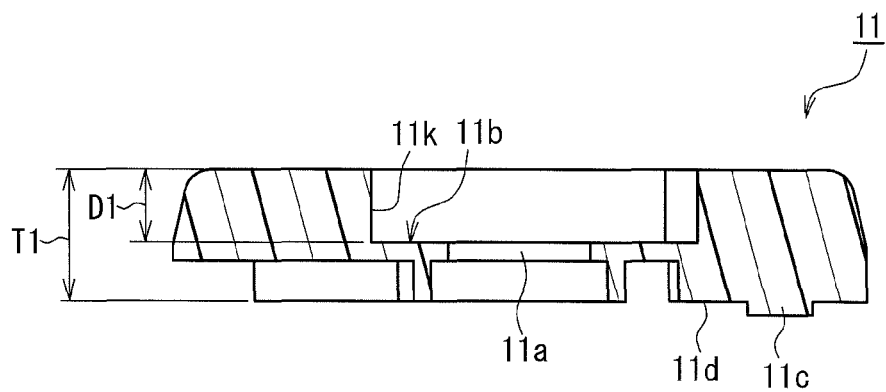
FIG. 4C is a cross-sectional view taken along line X-X in FIG. 4B.

FIG. 4A is a plan view of the ground contact surface 11h side of the ground contact member 11. FIG. 4B is a plan view of a back surface of the ground contact member 11 (the opposite side from the ground contact surface 11h). FIG. 4C is a cross-sectional view taken along line X-X in FIG. 4B. As shown in FIGS. 4A to 4C, the ground contact member 11 includes the hole portion 11a, a receiving surface 11b, a positioning protrusion 11c, a first surface 11d, a second surface 11e, a third surface 11f, a fourth surface 11g, the ground contact surface 11h, a ground contact surface recess 11k, and a marker recess 11m.

The hole portion 11a is formed in the center of the receiving surface 11b. The hole portion 11a has an inner diameter R1 that is larger than the outer diameter R52 (described later with reference to FIG. 6B) of the cylinder portion 13b of the screw 13 and smaller than an outer diameter R51 (described later with reference to FIG. 6B) of the head portion 13a of the screw 13.

The receiving surface 11b is a portion around the hole portion 11a in the ground contact surface recess 11k. The receiving surface 11b is a surface on which the head portion 13a of the screw 13 can abut when the ground contact member 11 and the height adjustment member 12 are joined to the recess 14 with the screw 13.

The positioning protrusion 11c is formed on the first surface 11d. The positioning protrusion 11c has such outer diameter and a height that it can engage positioning recesses 12m, 12n, and 12p formed in the height adjustment member 12.

The first surface 11d, the second surface 11e, and the third surface 11f are formed to be higher than the fourth surface 11g and are at mutually the same height. The first surface 11d, the second surface 11e, and the third surface 11f are, as shown in FIG. 4B, arranged in positions at which distances between a line segment L1 passing through the center of the first surface 11d and the center of the hole portion 11a, a line segment L2 passing through the center of the second surface 11e and the center of the hole portion 11a, and a line segment L3 passing through the center of the third surface 11f and the center of the hole portion 11a are equal. That is to say, the first surface 11d, the second surface 11e, and the third surface 11f are arranged in positions at which the line segments L1 to L3 are equiangularly spaced (at intervals of 120 degrees). The fourth surface 11g is disposed between the first surface 11d and the second surface 11e, between the second surface 11e and the third surface 11f, and between the third surface 11f and the first surface 11d, and extends in a single plane.

The ground contact surface 11h is a surface that will be brought into contact with the mounting plane when, in a state in which the foot portion 10a is attached to the first housing 1, the notebook computer is placed on the desktop in such a position that the under surface 1b of the first housing 1 opposes the mounting plane.

The ground contact surface recess 11k is formed in the center of the ground contact surface 11h. The ground contact surface recess 11k has a space that can accommodate at least the head portion 13a of the screw 13. The ground contact surface recess 11k is formed to have a depth D1 (FIG. 4C) that is at least larger than the thickness of the head portion 13a of the screw 13. The head portion 13a of the screw 13 is therefore prevented from protruding from the ground contact member 11, and, as a result, the position of the notebook computer is stabilized when it is placed on the desktop or the like.

The marker recess 11m is formed in an inner circumferential surface of the ground contact surface recess 11k, and is formed so as to enable a user visually to determine the rotational position of the ground contact member 11. In the present embodiment, the marker recess 11m is formed in the same direction as the direction in which the positioning protrusion 11c is disposed as viewed from the center of the ground contact member 11, but the position of the marker recess 11m is not limited to this position.

Figure 5A:
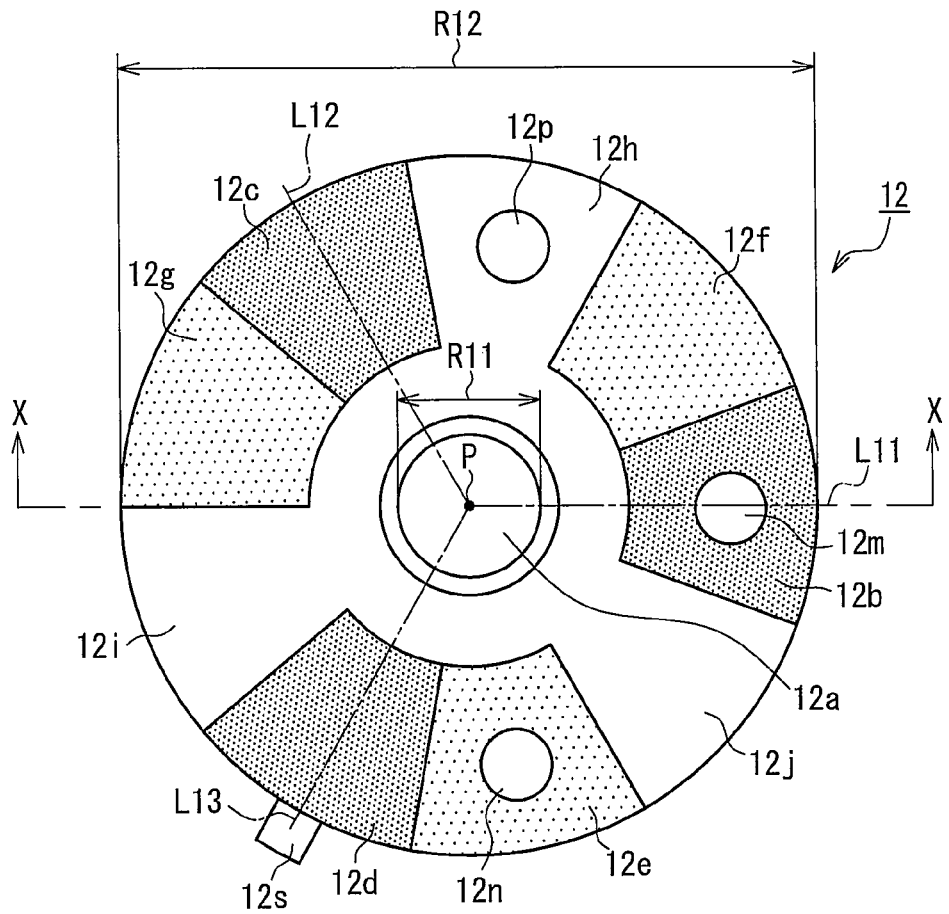
FIG. 5A is a plan view of a height adjustment member.
Figure 5B:
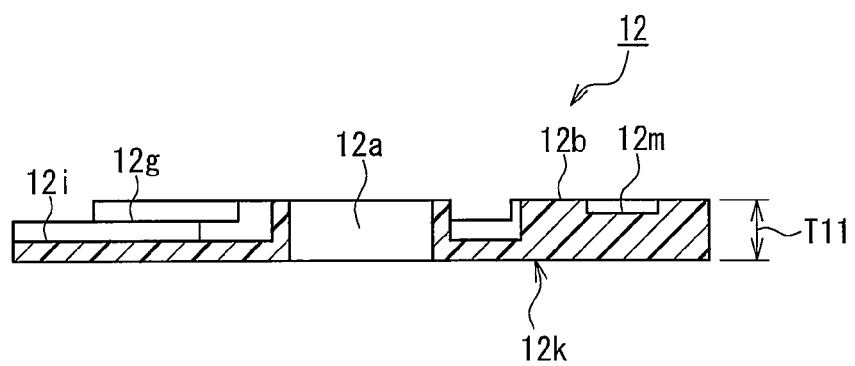
FIG. 5B is a cross-sectional view taken along line X-X in FIG. 5A.
Figure 5C:
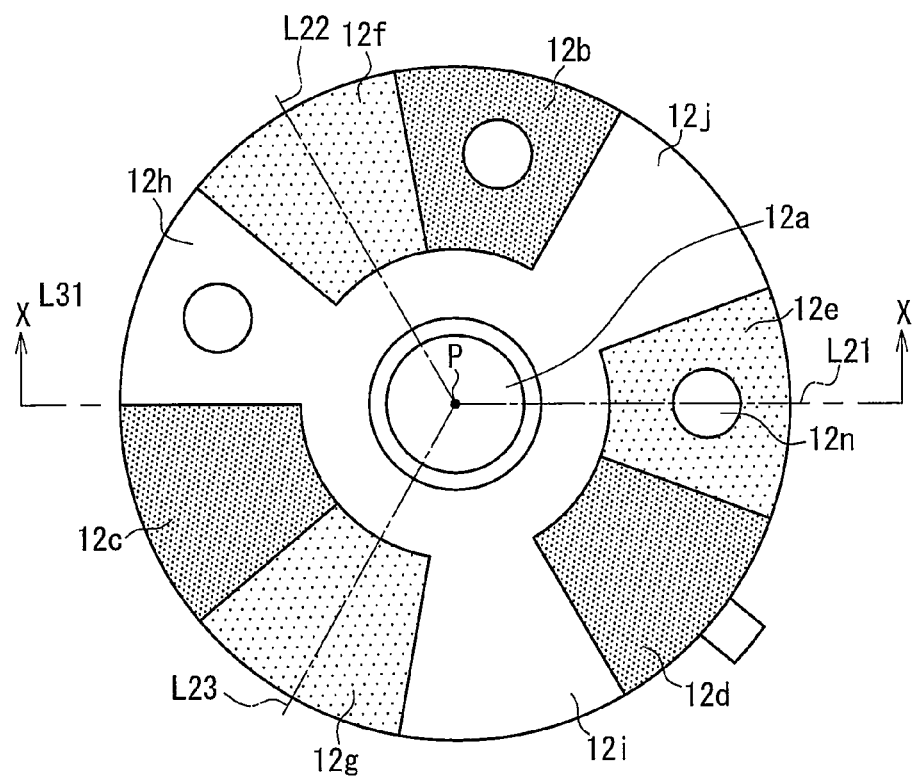
FIG. 5C is a plan view of the height adjustment member.
Figure 5D:
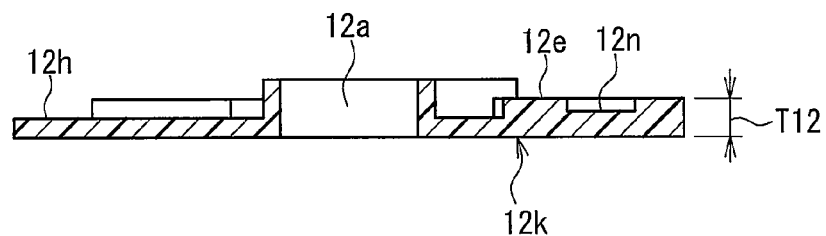
FIG. 5D is a cross-sectional view taken along line X-X in FIG. 5C.
Figure 5E:
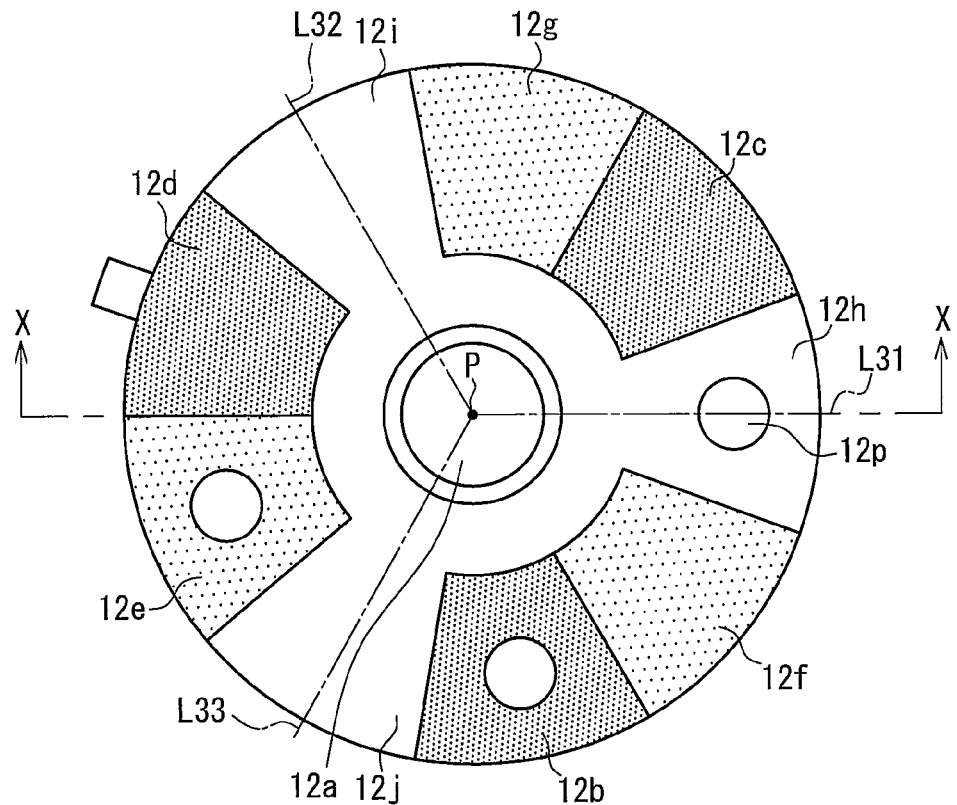
FIG. 5E is a plan view of the height adjustment member.
Figure 5F:
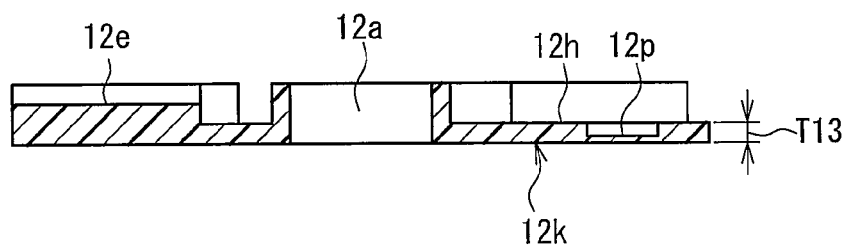
FIG. 5F is a cross-sectional view taken along line X-X in FIG. 5E.

FIGS. 5A, 5C, and 5E are plan views of the height adjustment member 12. FIG. 5B is a cross-sectional view taken along line X-X in FIG. 5A. FIG. 5D is a cross-sectional view taken along line X-X in FIG. 5C. FIG. 5F is a cross-sectional view taken along line X-X in FIG. 5E. It should be noted that FIGS. 5A, 5C, and 5E are diagrams for clearly illustrating the cross sections (taken along line X-X), and show different states of the single height adjustment member 12 in which the height adjustment member 12 has been rotated, and substantially the same configuration is shown in these diagrams.

The height adjustment member 12 includes the hole portion 12a, a first height restricting portion 12b, a second height restricting portion 12c, a third height restricting portion 12d, a fourth height restricting portion 12e, a fifth height restricting portion 12f, a sixth height restricting portion 12g, a seventh height restricting portion 12h, an eighth height restricting portion 12i, a ninth height restricting portion 12j, the first positioning recess 12m, the second positioning recess 12n, the third positioning recess 12p, and the tab 12s. The outer diameter R12 of the height adjustment member 12 excluding the tab 12s is at least smaller than the inner diameter R41 (described later with reference to FIG. 6A) of the recess 14. The outer diameter of the height adjustment member 12 including the tab 12s is at least larger than the inner diameter R41 (described later with reference to FIG. 6A) of the recess 14. Moreover, in FIGS. 5A, 5C, and 5E, the first height restricting portion 12b, the second height restricting portion 12c, and the third height restricting portion 12d are indicated by high-density dot hatching, and the fourth height restricting portion 12e, the fifth height restricting portion 12f, and the sixth height restricting portion 12g are indicated by low-density dot hatching in order to clearly show the height relationship among the first height restricting portion 12b, the second height restricting portion 12c, the third height restricting portion 12d, the fourth height restricting portion 12e, the fifth height restricting portion 12f, the sixth height restricting portion 12g, the seventh height restricting portion 12h, the eighth height restricting portion 12i, and the ninth height restricting portion 12j.

The hole portion 12a is formed in the center of the height adjustment member 12. The hole portion 12a has an inner diameter Rh that is at least larger than the outer diameter R52 (described later with reference to FIG. 6B) of the cylinder portion 13b of the screw 13.

The first height restricting portion 12b, the second height restricting portion 12c, and the third height restricting portion 12d have mutually the same thickness T11 (see FIG. 5B). The first height restricting portion 12b, the second height restricting portion 12c, and the third height restricting portion 12d are, as shown in FIG. 5A, arranged in positions at which distances between a line segment L11 passing through the center of the first height restricting portion 12b and a center P of the hole portion 12a, a line segment L12 passing through the center of the second height restricting portion 12c and the center P of the hole portion 12a, and a line segment L13 passing through the center of the third height restricting portion 12d and the center P of the hole portion 12a are equal. That is to say, the first height restricting portion 12b, the second height restricting portion 12c, and the third height restricting portion 12d are arranged in positions at which the line segments L11 to L13 are equiangularly spaced (at intervals of 120 degrees).

The fourth height restricting portion 12e, the fifth height restricting portion 12f, and the sixth height restricting portion 12g have mutually the same thickness T12 (see FIG. 5D). The fourth height restricting portion 12e, the fifth height restricting portion 12f, and the sixth height restricting portion 12g are, as shown in FIG. 5C, arranged in positions at which distances between a line segment L21 passing through the center of the fourth height restricting portion 12*e* and the center P of the hole portion 12*a*, a line segment L22 passing through the center of the fifth height restricting portion 12*f* and the center P of the hole portion 12*a*, and a line segment L23 passing through the center of the sixth height restricting portion 12*g* and the center P of the hole portion 12*a* are equal. That is to say, the fourth height restricting portion 12*e*, the fifth height restricting portion 12*f*, and the sixth height restricting portion 12*g* are arranged in positions at which the line segments L21 to L23 are equiangularly spaced (at intervals of 120 degrees).

The seventh height restricting portion 12*h*, the eighth height restricting portion 12*i*, and the ninth height restricting portion 12*j* have mutually the same thickness T13 (see FIG. 5F). The seventh height restricting portion 12*h*, the eighth height restricting portion 12*i*, and the ninth height restricting portion 12*j* are, as shown in FIG. 5E, arranged in positions at which distances between a line segment L31 passing through the center of the seventh height restricting portion 12*h* and the center P of the hole portion 12*a*, a line segment L32 passing through the center of the eighth height restricting portion 12*i* and the center P of the hole portion 12*a*, and a line segment L33 passing through the center of the ninth height restricting portion 12*j* and the center P of the hole portion 12*a* are equal. That is to say, the seventh height restricting portion 12*h*, the eighth height restricting portion 12*i*, and the ninth height restricting portion 12*j* are arranged in positions at which the line segments L31 to L33 are equiangularly spaced (at intervals of 120 degrees).

It should be noted that adjacent height restricting portions of all the height restricting portions 12*b* to 12*j* are arranged equidistantly and equiangularly (at every 40 degrees) in a circumferential direction of the height adjustment member 12. That is to say, all the adjacent line segments of the line segments L11 to L13, L21 to L23, and L31 to L33 are spaced at equal intervals.

Moreover, the thickness T11 of the first height restricting portion 12*b*, the second height restricting portion 12*c*, and the third height restricting portion 12*d*, the thickness T12 of the fourth height restricting portion 12*e*, the fifth height restricting portion 12*f*, and the sixth height restricting portion 12*g*, and the thickness T13 of the seventh height restricting portion 12*h*, the eighth height restricting portion 12*i*, and the ninth height restricting portion 12*j* have the following relationship:

T11>T12>T13     (Relation 1).

Moreover, all of the differences in thickness d1 (=T11−T12), d2 (=T12−T13), and d3 (=T11−T13) of the height restricting portions 12*b* to 12*j* may be set to the same dimension. Furthermore, although the differences in thickness d1 to d3 are individually set to 0.2 mm in the present embodiment, this value is to be understood as merely an example.

The first positioning recess 12*m* is formed in the first height restricting portion 12*b*. The second positioning recess 12*n* is formed in the fourth height restricting portion 12*e*. The third positioning recess 12*p* is formed in the seventh height restricting portion 12*h*. It is sufficient that the first positioning recess 12*m*, the second positioning recess 12*n*, and the third positioning recess 12*p* each have a size that allows engagement with at least the positioning protrusion 11*c* formed on the ground contact member 11. Preferably, these recesses have mutually the same opening area and depth. The first positioning recess 12*m*, the second positioning recess 12*n*, and the third positioning recess 12*p* are formed so that they each have a circular opening shape, and the center of each opening is disposed on the circumference of an imaginary circle centered on the center P of the hole portion 12*a*. Thus, when the ground contact member 11 is rotated around the center P, the positioning protrusion 11*c* can selectively engage any one of the first positioning recess 12*m*, the second positioning recess 12*n*, and the third positioning recess 12*p*.

The tab 12*s* is formed on the outer circumferential cylindrical surface of the height adjustment member 12 so as to protrude therefrom. It is sufficient that the tab 12*s* has such outer dimensions that it can at least engage the positioning recess 14*c* (see FIG. 3) formed in the recess 14. The tab 12*s* restricts displacement of the height adjustment member 12 in the circumferential direction (rotation around the center P) by engaging the positioning recess 14*c* formed in the first housing 1.

3. Method for Adjusting Height of Foot Portion 10*a*

Figure 6A:
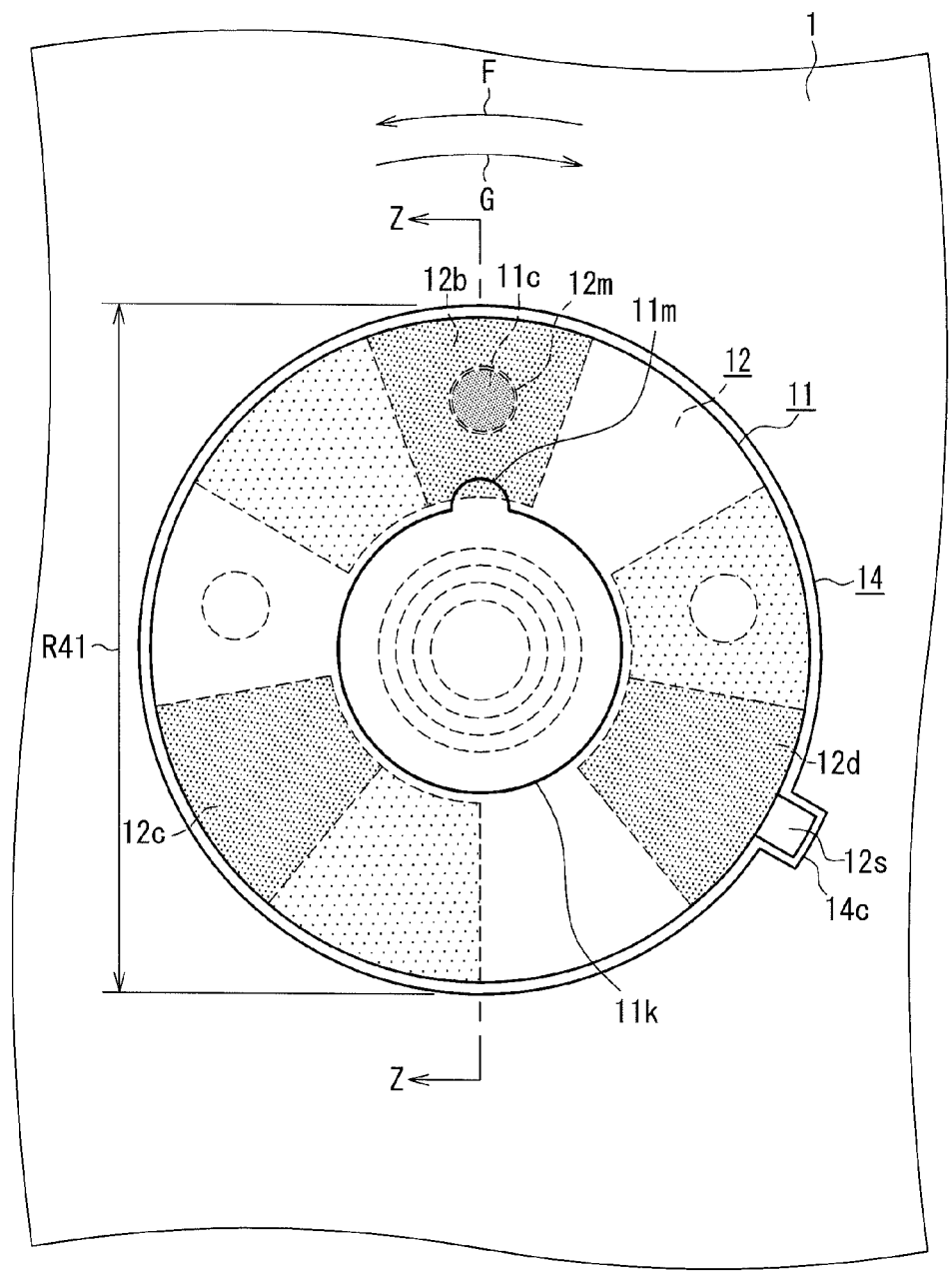
FIG. 6A is a plan view of a foot portion (the first position).
Figure 6B:
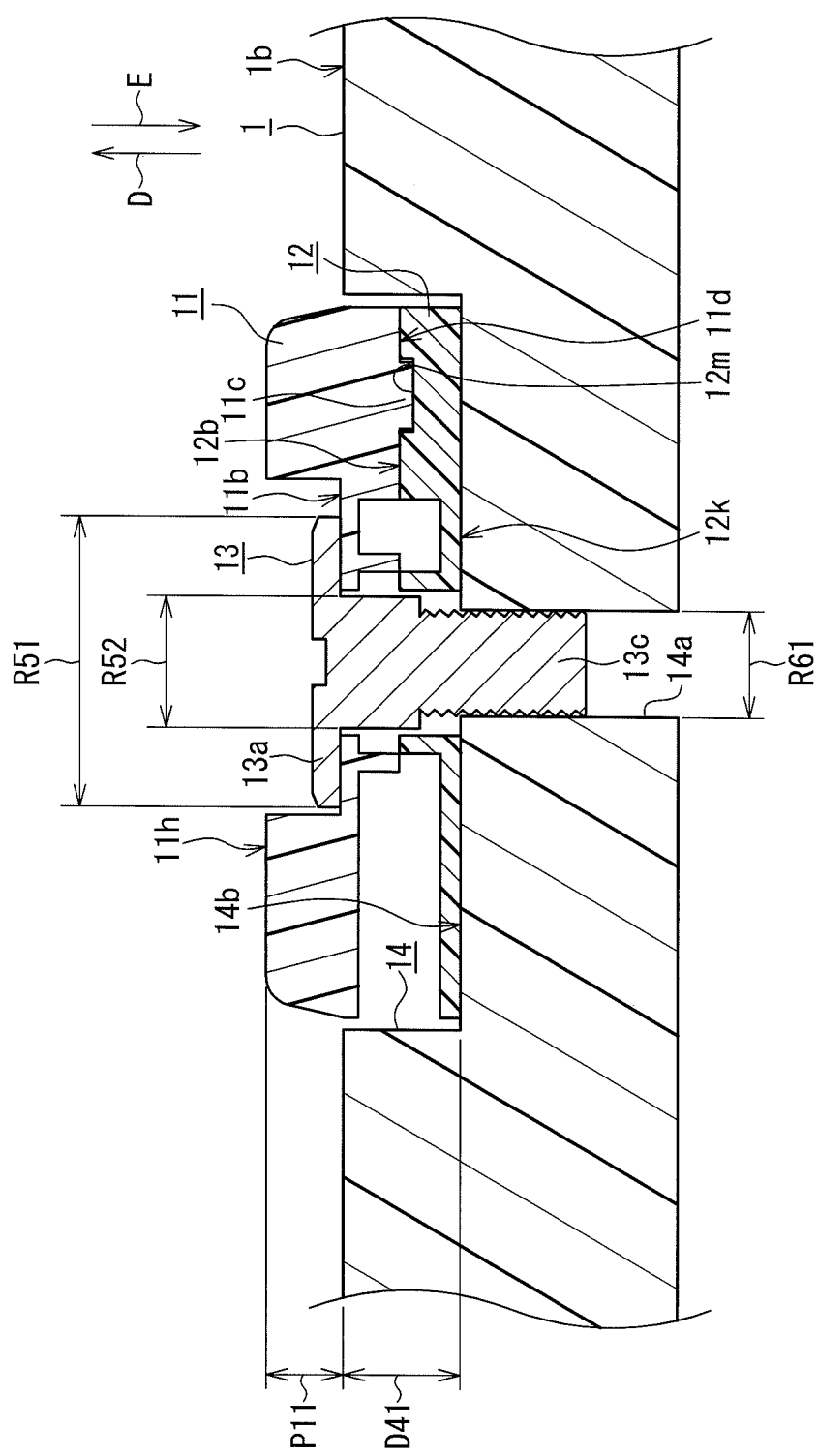
FIG. 6B is a cross-sectional view taken along line Z-Z in FIG. 6A.
Figure 7A:
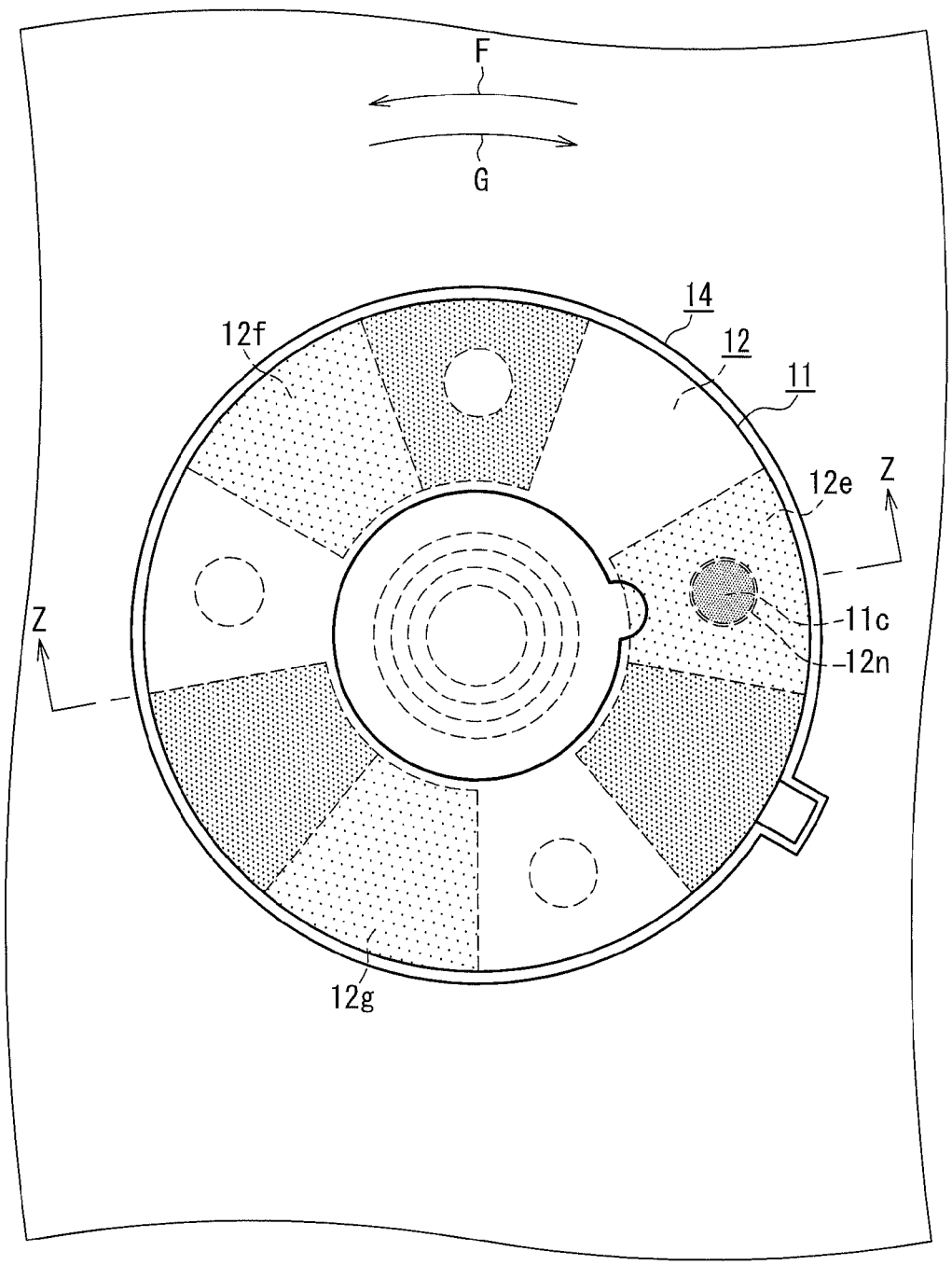
FIG. 7A is a plan view of the foot portion (the second position).
Figure 7B:
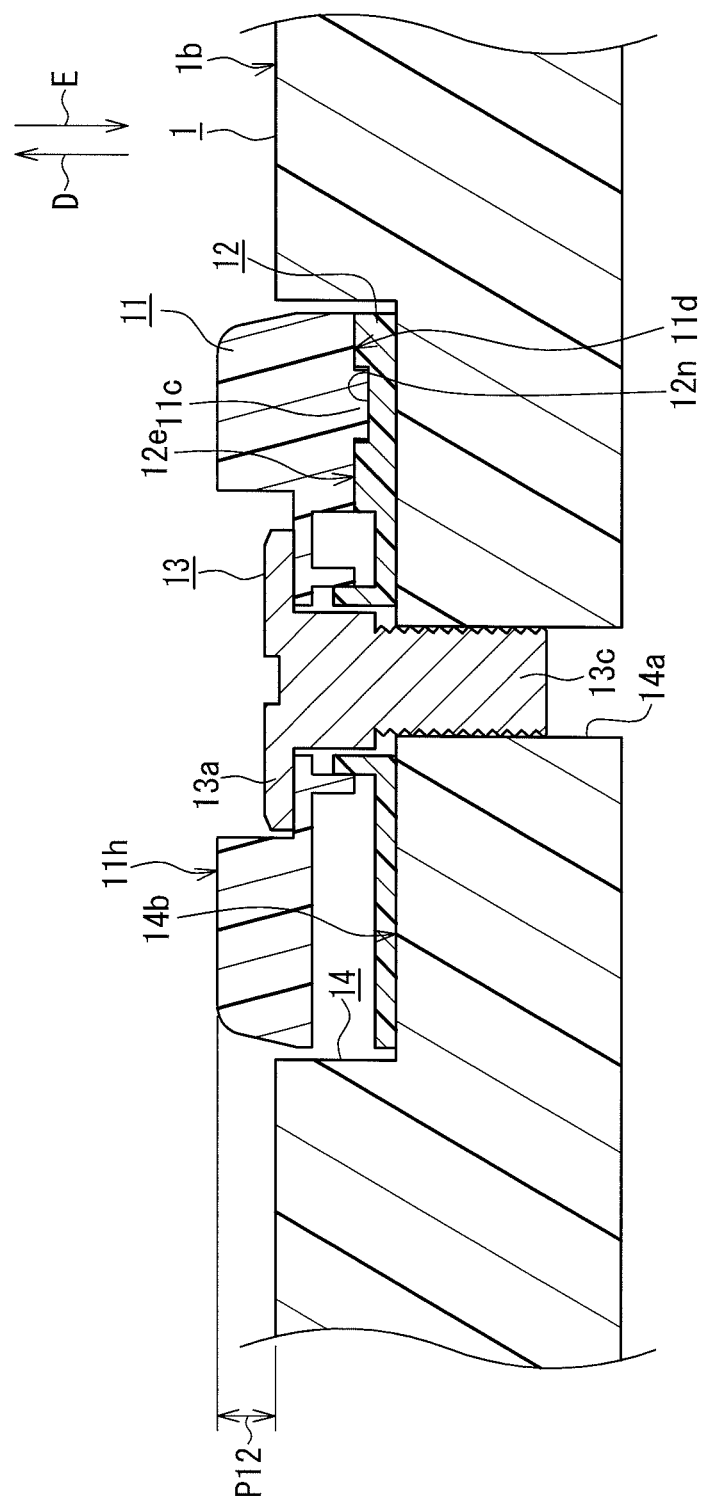
FIG. 7B is a cross-sectional view taken along line Z-Z in FIG. 7A.
Figure 8A:
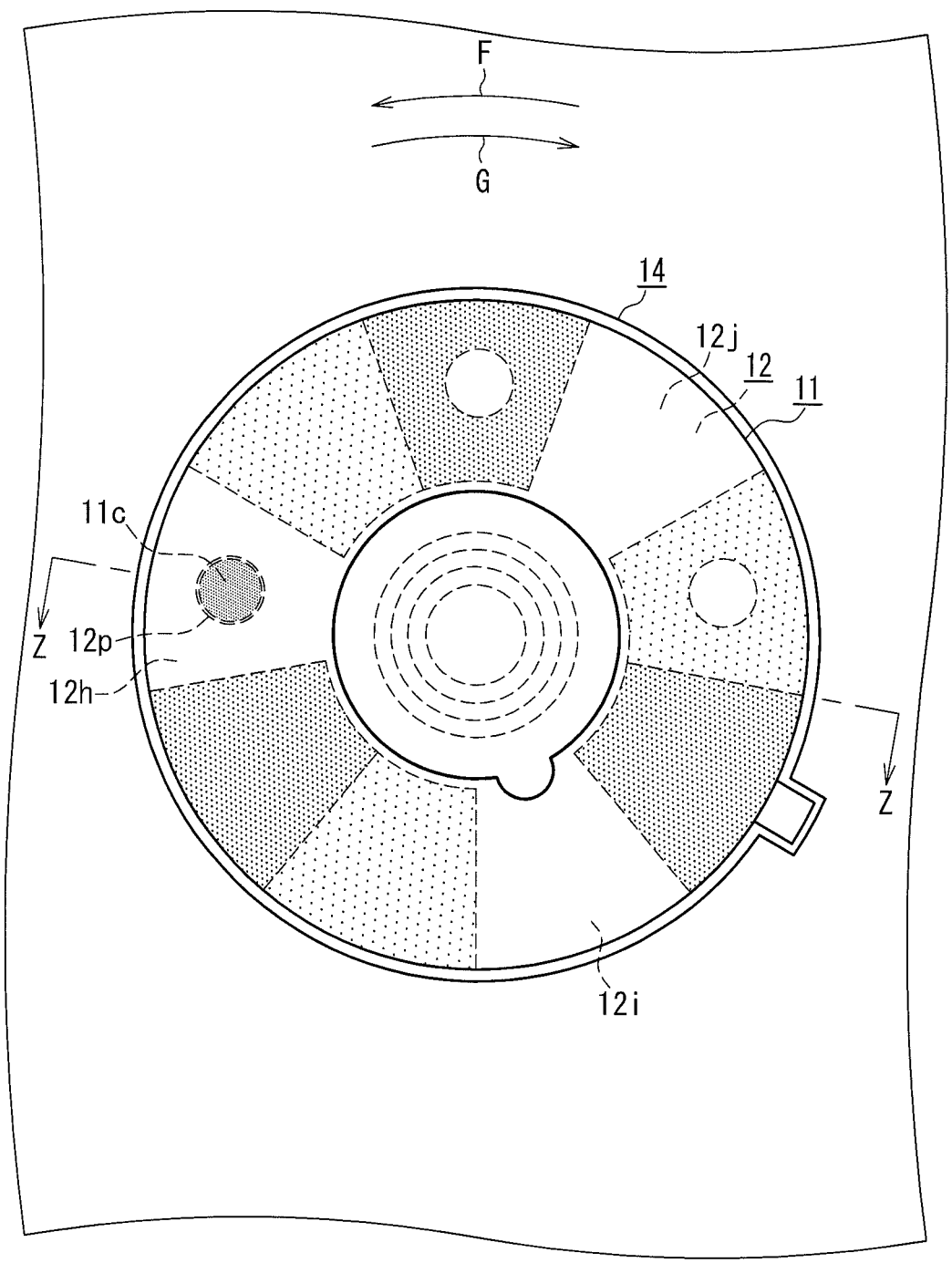
FIG. 8A is a plan view of the foot portion (the third position).
Figure 8B:
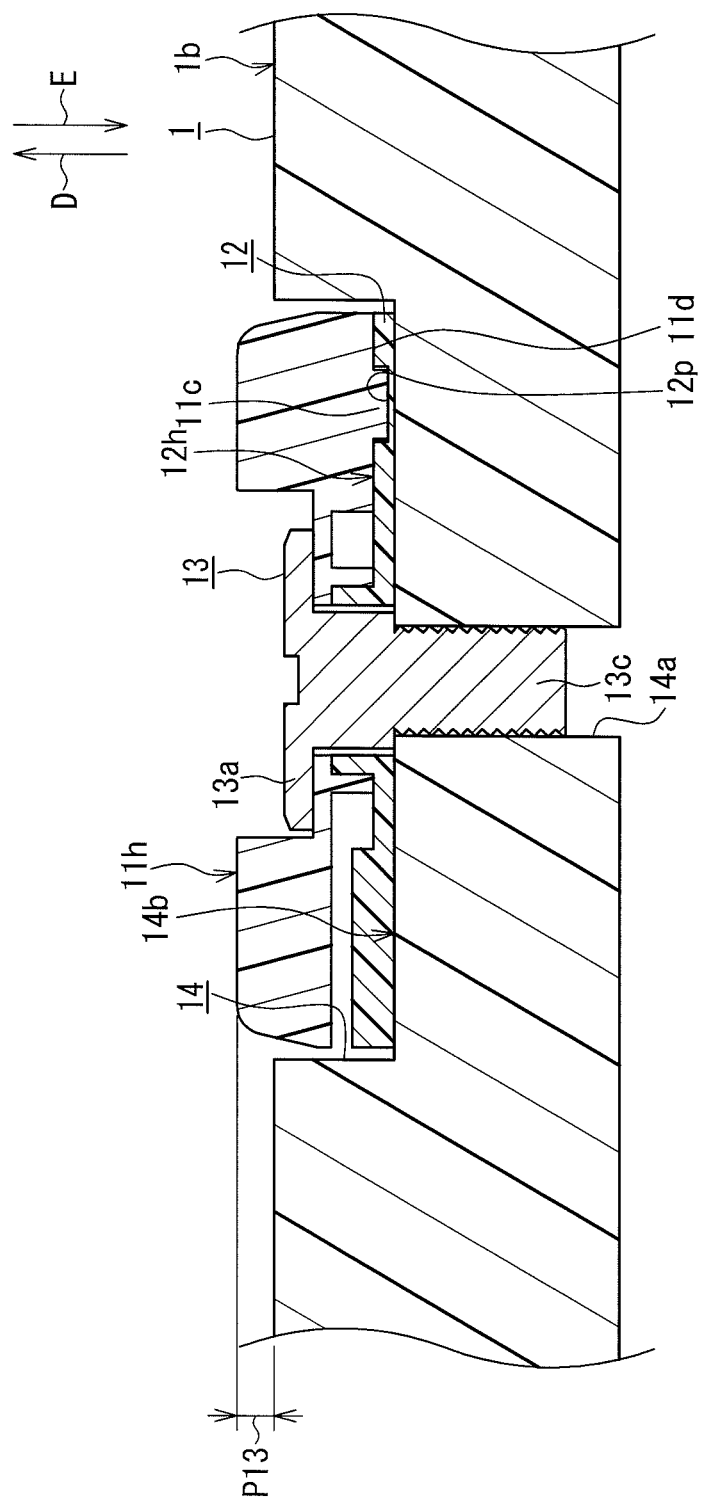
FIG. 8B is a cross-sectional view taken along line Z-Z in FIG. 8A.

FIG. 6A is a plan view of the foot portion 10*a* when the ground contact member 11 is in a first position. FIG. 6B is a cross-sectional view taken along line Z-Z in FIG. 6A. FIG. 7A is a plan view of the foot portion 10*a* when the ground contact member 11 is in a second position. FIG. 7B is a cross-sectional view taken along line Z-Z in FIG. 7A. FIG. 8A is a plan view of the foot portion 10*a* when the ground contact member 11 is in a third position. FIG. 8B is a cross-sectional view taken along line Z-Z in FIG. 8A.

As shown in FIGS. 6A to 8B, the position of the ground contact member 11 can be displaced to any of the first position, the second position, and the third position at which the ground contact surface 11*h* has different heights (which may correspond to, for example, a protruding amount P11 shown in FIG. 6B) relative to the under surface 1*b* of the first housing 1. Hereinafter, an operation that is performed when the ground contact member 11 successively is displaced to the first position, the second position, and the third position in this order will be described as an example of the height adjustment method.

The foot portion 10*a* is, as shown in FIG. 6B and the like, fixed to the first housing 1 with the ground contact member 11 and the height adjustment member 12 disposed in the recess 14 and joined by the screw 13. At this time, an under surface 12*k* of the height adjustment member 12 abuts on the bottom surface 14*b* of the recess 14. Moreover, the position of the height adjustment member 12 in the circumferential direction is restricted by the tab 12*s* engaging the positioning recess 14*c*, as shown in FIG. 6A and the like. The ground contact member 11 is sandwiched between the head portion 13*a* of the screw 13 and the height adjustment member 12, and its position in directions indicated by arrows D and E is restricted. Moreover, the position of the ground contact member 11 in the circumferential direction (directions indicated by arrows F and G shown in FIG. 6A) is restricted by the positioning protrusion 11*c* engaging any one of the first positioning recess 12*m*, the second positioning recess 12*n*, and the third positioning recess 12*p*. With regard to the screw 13, the head portion 13*a* abuts on the receiving surface 11*b*, the cylinder portion 13*b* is inserted in the hole portion 11*a* and the hole portion 12*a*, and the screw portion 13*c* is screwed in the screw hole 14*a*.

First, as shown in FIGS. 6A and 6B, when the ground contact member 11 is in the first position, the positioning protrusion 11*c* formed on the ground contact member 11 engages the first positioning recess 12*m* formed in the height adjustment member 12. Moreover, the first surface 11*d* of the ground contact member 11 abuts on the first height restricting portion 12*b*. The second surface 11*e* of the ground contact member 11 abuts on the third height restricting portion 12*d*. The third surface 11*f* of the ground contact member 11 abuts on the second height restricting portion 12*c*. Since the height dimension T11 (see FIG. 5B) of the first height restricting portion 12b, the second height restricting portion 12c, and the third height restricting portion 12d is higher than the height dimensions T12 and T13 of the other height restricting portions (see Relation 1 above), the protruding amount P11 of the ground contact member 11 in the first position is larger than protruding amounts P12 and P13, which will be described later, of the ground contact member 11 in the second position and the third position. It should be noted that the protruding amount P11 corresponds to the difference in height between the ground contact surface 11h of the ground contact member 11 and the under surface 1b of the first housing 1.

In the case where the foot portion 10a is displaced from the first position to the second position, the screw 13 is first rotated so that it is displaced in the direction indicated by arrow D to loosen the screwed-in state of the ground contact member 11 and the height adjustment member 12. At this time, the screw 13 is displaced in the direction indicated by arrow D until it reaches a position at which at least the positioning protrusion 11c and the first positioning recess 12m can be disengaged. Then, the positioning protrusion 11c and the first positioning recess 12m are disengaged, and the ground contact member 11 is thus in a state in which it can be rotated in the direction indicated by arrow F or G. Then, the ground contact member 11 is rotated in the direction indicated by arrow G (or may be rotated in the direction indicated by arrow F) to engage the positioning protrusion 11c with the second positioning recess 12n. Then, the screw 13 is rotated and displaced in the direction indicated by arrow E. At this time, the screw 13 is displaced in the direction indicated by arrow E until it reaches a position at which at least the positioning protrusion 11c is prevented from being disengaged from the second positioning recess 12n. Thus, as shown in FIGS. 7A and 7B, the ground contact member 11 and the height adjustment member 12 can be joined to the first housing 1 by screwing, and displacement of the ground contact member 11 to the second position is completed.

As shown in FIGS. 7A and 7B, when the ground contact member 11 is in the second position, the positioning protrusion 11c formed in the ground contact member 11 engages the second positioning recess 12n formed in the height adjustment member 12. Moreover, the first surface 11d of the ground contact member 11 abuts on the fourth height restricting portion 12e. The second surface 11e of the ground contact member 11 abuts on the sixth height restricting portion 12g. The third surface 11f of the ground contact member 11 abuts on the fifth height restricting portion 12f. Since the height dimension T12 (see FIG. 5D) of the fourth height restricting portion 12e, the fifth height restricting portion 12f, and the sixth height restricting portion 12g is lower than the height dimension of T11 of the first height restricting portion 12b and the like and higher than the height dimension T13 of the seventh height restricting portion 12h and the like (see Relation 1 above), the protruding amount P12 of the ground contact member 11 in the second position is smaller than the protruding amount P11 of the ground contact member 11 in the first position and larger than the protruding amount P13 of the ground contact member 11 in the third position, which will be described later. It should be noted that the protruding amount P12 is the difference in height between the ground contact surface 11h of the ground contact member 11 and the under surface 1b of the first housing 1.

In the case where the foot portion 10a is displaced from the second position to the third position, the screw 13 is first rotated so that it is displaced in the direction indicated by arrow D to loosen the screwed-in state of the ground contact member 11 and the height adjustment member 12. The screw 13 is displaced in the direction indicated by arrow D until it reaches a position at which at least the positioning protrusion 11c and the second positioning recess 12n can be disengaged. Then, the positioning protrusion 11c is disengaged from the second positioning recess 12n, and the ground contact member 11 is thus in a state in which it can be rotated in the direction indicated by arrow F or G. Then, the ground contact member 11 is rotated in the direction indicated by arrow G (or may be rotated in the direction indicated by arrow G) to engage the positioning protrusion 11c with third positioning recess 12p. Then, the screw 13 is rotated and displaced in the direction indicated by arrow E. At this time, the screw 13 is displaced in the direction indicated by arrow E until it reaches a position at which at least the positioning protrusion 11c is prevented from being disengaged from the third positioning recess 12p. Thus, as shown in FIGS. 8A and 8B, the ground contact member 11 and the height adjustment member 12 are joined to the first housing 1 by screwing, and displacement of the ground contact member 11 to the third position is completed.

As shown in FIGS. 8A and 8B, when the ground contact member 11 is in the third position, the positioning protrusion 11c formed on the ground contact member 11 engages the third positioning recess 12p formed in the height adjustment member 12. Moreover, the first surface 11d of the ground contact member 11 abuts on the seventh height restricting portion 12h. The second surface 11e of the ground contact member 11 abuts on the ninth height restricting portion 12j. The third surface 11f of the ground contact member 11 abuts on the eighth height restricting portion 12i. Since the height dimension T13 (see FIG. 5F) of the seventh height restricting portion 12h, the eighth height restricting portion 12i, and the ninth height restricting portion 12j is lower than the height dimension T11 of the first height restricting portion 12b and the like and the height dimension T12 of the fourth height restricting portion 12e and the like (see Relation 1 above), the protruding amount P13 of the ground contact member 11 in the third position is smaller than the above-described protruding amounts P11 and P12. It should be noted that the protruding amount P13 is the difference in height between the ground contact surface 11h of the ground contact member 11 and the under surface 1b of the first housing 1.

That is to say, the protruding amount P11 of the ground contact member 11 in the first position, the protruding amount P12 of the ground contact member 11 in the second position, and the protruding amount P13 of the ground contact member 11 in the third position have the following relationship:

$$P11 > P12 > P13.$$

Moreover, the outer diameter R52 (see FIG. 6B) of the cylinder portion 13b of the screw 13 is set to be larger than the outer diameter of the screw portion 13c and an inner diameter R61 (see FIG. 6B) of the screw hole 14a is set to be smaller than the outer diameter R52 of the cylinder portion 13b, and therefore, as shown in FIGS. 8A and 8B, when the ground contact member 11 is in the third position, a lower end (the screw portion 13c side) of the cylinder portion 13b of the screw 13 can abut on the bottom surface 14b of the recess 14 of the first housing 1. With such a configuration, erroneously displacing (i.e., advancing screwing of) the screw 13 further in the direction indicated by arrow E from the position shown in FIGS. 8A and 8B can be prevented.

In the case where the ground contact member 11 is displaced from the third position to the second position or the first position, displacement can be achieved according to the same procedure as described above.

Rotating the ground contact member 11 in the direction indicated by arrow F or G also results in displacement of the marker recess 11m formed in the ground contact member 11. The user can determine the rotational position of the ground contact member 11 by visually observing the position of the marker recess 11m and determine the protruding amount of the ground contact member 11.

4. Effects of Embodiment, etc.

According to the present embodiment, since at least one foot portion 10a of the foot portions of the notebook computer is provided with the height adjustment mechanism consisting of the ground contact member 11, the height adjustment member 12, and the screw 13, even if a variation in height dimension among the foot portions, deformation of the first housing 1, or the like causes the first housing 1 to become unsteady, the unsteadiness of the first housing 1 can be cancelled by adjusting the height of the foot portion 10a to any height.

In particular, if the thickness of the housing is reduced in order to obtain a thinner and more lightweight notebook computer, the rigidity of the housing may be reduced and the housing may more easily be deformed. Once the housing is deformed, when the notebook computer is mounted on a mounting plane such as the desktop or the like, a state in which not all of the plurality of foot portions disposed on the under surface of the housing are in contact with the mount plane may arise, resulting in a problem that the position of the notebook computer becomes unstable. To address this issue, at least one of the foot portions is rendered height-adjustable as described in the present embodiment, and thus the problem as described above can be solved.

In the present embodiment, the height (protruding amount) of the ground contact member 11 can be adjusted by simply loosening the screw 13 and rotating the ground contact member 11, and therefore the workability during adjustment can be improved.

In the present embodiment, the ground contact member 11 is provided with the positioning protrusion 11c, the height adjustment member 12 is provided with the first positioning recess 12m, the second positioning recess 12n, and the third positioning recess 12p, and the positioning protrusion 11c selectively can be engaged with any one of the first positioning recess 12m, the second positioning recess 12n, and the third positioning recess 12p. Thus, positioning of the ground contact member 11 relative to the height adjustment member 12 in the circumferential direction can be performed, and the workability during height adjustment of the ground contact member 11 can be improved.

In the present embodiment, the first surface 11d, the second surface 11e, and the third surface 11f of the ground contact member 11 are flat surfaces. Furthermore, the surfaces of the first height restricting portion 12b, the second height restricting portion 12c, the third height restricting portion 12d, the fourth height restricting portion 12e, the fifth height restricting portion 12f, the sixth height restricting portion 12g, the seventh height restricting portion 12h, the eighth height restricting portion 12i, and the ninth height restricting portion 12j of the height adjustment member 12 on which the ground contact member 11 can abut are flat surfaces. Thus, no matter whether the ground contact member 11 is in the first position, the second position, or the third position, a flat surface thereof and a flat surface of the mounting plane are brought into surface contact with each other, and therefore, the position of the ground contact member 11 relative to the height adjustment member 12 is stabilized. Accordingly, the position of the notebook computer is stabilized.

In the present embodiment, the height adjustment member 12 is provided with the tab 12s, the recess 14 is provided with the positioning recess 14c, and the tab 12s can be engaged with the positioning recess 14c, and thus, when the ground contact member 11 is rotated in the direction indicated by arrow F or G in order to adjust the height of the ground contact member 11, the height adjustment member 12 can be prevented from accidentally rotating. Thus, the workability during height adjustment of the ground contact member 11 can be improved.

In the present invention, the outer diameter of the cylinder portion 13b of the screw 13 is set to be larger than the outer diameter of the screw portion 13c, and the inner diameter of the screw hole 14a is set to be smaller than the outer diameter of the cylinder portion 13b, and thus, when the ground contact member 11 is in the third position at which the protruding amount is minimum, the lower end (screw portion 13c side) of the cylinder portion 13b of the screw 13 can abut on the bottom surface 14b of the recess 14 of the first housing 1. With such a configuration, erroneously displacing (i.e., advancing screwing of) the screw 13 further in the direction indicated by arrow E from the position shown in FIGS. 8A and 8B can be prevented.

In the present embodiment, the ground contact member 11 is provided with the marker recess 11m, and thus, the user can determine the rotational position of the ground contact member 11 based on the marker recess 11m. Once the user determines the rotational position of the ground contact member 11, the user can determine the protruding amount of the ground contact member 11. That is to say, the user visually can determine whether the ground contact member 11 is in the first position, the second position, or the third position based on the position of the marker recess 11m. In particular, since the height of the foot portion 10a of the present embodiment is adjusted in steps of 0.2 mm, it is difficult to visually determine the height of the ground contact member 11. For this reason, the marker recess 11m is provided as in the present embodiment, and therefore, the height of the ground contact member 11 can be determined based on the position of the marker recess 11m.

It should be noted that although a configuration in which the foot portion 10a out of the four foot portions 10a to 10d shown in FIG. 2 is provided with the height adjustment mechanism was described in the present embodiment, any one of the foot portions 10b to 10d also may be provided with the height adjustment mechanism. Moreover, the number of foot portions provided with the height adjustment mechanism is not limited to one, and a plurality of foot portions may be provided with the height adjustment mechanism.

Although the ground contact member 11 was provided with three surfaces (the first surface 11d, the second surface 11e, the third surface 11f) that can abut on the height adjustment member 12 in the present embodiment, it may be provided with four or more such surfaces.

Although the height adjustment member 12 was provided with nine height restricting portions in the present embodiment, the number of height restricting portions can be any number as long as it is a multiple of the number of the surfaces of the ground contact member 11 that can abut on the height adjustment member 12. The multiple can be used as the number of steps in which the height can be adjusted. Although the number of steps in which the height can be adjusted is three in the present embodiment, it is sufficient as long as the number of steps is at least two.

Although the ground contact member 11 was provided with the positioning protrusion 11c, and the height adjustment member 12 was provided with the positioning recesses 12m, 12n, and 12p in the present embodiment, the ground contact member 11 may be provided with a single positioning recess, and the height adjustment member 12 provided with a plurality of positioning protrusions.

Although the tab 12s was formed on the outer circumferential cylindrical surface of the height adjustment member 12 in the present embodiment, it may be formed on the under surface 12k so as to protrude therefrom. In this case, the positioning recess 14c, with which the tab 12s can engage, needs to be formed in the bottom surface 14b of the recess 14.

Although the marker recess 11m was provided in order to determine the rotational position of the ground contact member 11 in the present embodiment, other components may be adopted as long as the user can visually determine at least the rotational position of the ground contact member 11. For example, a mark of any desired color may be put on the ground contact surface 11h of the ground contact member 11 instead of the marker recess 11m.

Although the foot portion 10a was disposed in the recess 14 of the first housing 1 in the present embodiment, it may be disposed on the under surface 1b of the first housing 1. That is to say, the recess 14 is not essential.

Although the screw 13 was used to retain the ground contact member 11 and the height adjustment member 12 on the first housing 1 in the present embodiment, a retaining member other than a screw can be used as long as it can retain the ground contact member 11 and the height adjustment member 12 on the first housing 1. For example, a configuration in which a cylindrical pin is fitted in a hole formed in a position corresponding to the screw hole 14a of the first housing 1 while being biased by a coil spring or the like may be adopted.

The first housing 1 of the present embodiment is an example of the housing. Since the under surface 1b of the first housing 1 and the bottom surface 14b of the recess 14 of the present embodiment are surfaces opposing the mount plane on which the notebook computer is mounted, these surfaces can be regarded as the ground contact portion. The foot portions 10a to 10d of the present embodiment provide for an example of the plurality of foot portions. The notebook computer of the present embodiment is an example of the electronic apparatus. The foot portion 10a of the present embodiment is an example of at least one of the plurality of foot portions. The height adjustment member 12 of the present embodiment is an example of the height adjustment member. The under surface 12k of the present embodiment is an example of the surface on the first side of the height adjustment member. The first height restricting portion 12b, the second height restricting portion 12c, the third height restricting portion 12d, the fourth height restricting portion 12e, the fifth height restricting portion 12f, the sixth height restricting portion 12g, the seventh height restricting portion 12h, the eighth height restricting portion 12i, and the ninth height restricting portion 12j of the present embodiment provide for an example of the plurality of height adjustment surfaces on the second side of the height adjustment member. The ground contact member 11 of the present embodiment is an example of the ground contact member. The fourth surface 11g of the present embodiment is an example of the surface on the first side of the ground contact member. The first surface 11d, the second surface 11e, and the third surface 11f of the present embodiment provide for an example of the abutment surface. The ground contact surface 11h of the present embodiment is an example of the surface on the second side of the ground contact member. The screw 13 of the present embodiment is an example of the retaining member. The first positioning recess 12m, the second positioning recess 12n, and the third positioning recess 12p of the present embodiment provide for an example of the positioning recesses. The positioning protrusion 11c of the present embodiment is an example of the positioning protrusion. The tab 12s of the present embodiment is an example of the displacement restricting protrusion. The positioning recess 14c of the present embodiment is an example of the displacement restricting recess.

The disclosure of the present application is useful for an electronic apparatus that can be mounted on a desktop or the like.

What is claimed is:

1. An electronic apparatus, including a plurality of foot portions on an under surface of a housing thereof,
at least one of the plurality of foot portions comprising:
a height adjustment member, a surface on a first side thereof abutting on a bottom surface of a recess formed in the under surface of the housing and a surface on a second side thereof having a plurality of height adjustment surfaces of mutually different heights;
a ground contact member, a surface on a first side thereof being provided with an abutment surface that can abut on the height adjustment surfaces of the height adjustment member and a surface on a second side thereof protruding from the under surface of the housing; and
a retaining member detachably retaining the height adjustment member and the ground contact member on a ground contact portion,
wherein a protruding amount of the ground contact member from the under surface of the housing can be changed by causing the surface on the first side of the ground contact member to abut on any height adjustment surface of the plurality of height adjustment surfaces, and
wherein the height adjustment surfaces and the abutment surface are flat surfaces.

2. An electronic apparatus, including a plurality of foot portions on an under surface of a housing thereof,
at least one of the plurality of foot portions comprising:
a height adjustment member, a surface on a first side thereof abutting on a bottom surface of a recess formed in the under surface of the housing and a surface on a second side thereof having a plurality of height adjustment surfaces of mutually different heights;
a ground contact member, a surface on a first side thereof being provided with an abutment surface that can abut on the height adjustment surfaces of the height adjustment member and a surface on a second side thereof protruding from the under surface of the housing; and
a retaining member detachably retaining the height adjustment member and the ground contact member on a ground contact portion,
wherein a protruding amount of the ground contact member from the under surface of the housing can be changed by causing the surface on the first side of the ground contact member to abut on any height adjustment surface of the plurality of height adjustment surfaces,
wherein the height adjustment member is provided with a displacement restricting protrusion that is formed to protrude from an outer circumferential cylindrical surface thereof, and
wherein an edge portion of the recess is provided with a displacement restricting recess with which the displacement restricting protrusion can engage.

* * * * *